(12) United States Patent
Reichel et al.

(10) Patent No.: US 7,076,382 B2
(45) Date of Patent: Jul. 11, 2006

(54) METHOD OF MEASURING THE EFFECTIVE DIRECTIVITY AND/OR RESIDUAL SYSTEM PORT IMPEDANCE MATCH OF A SYSTEM-CALIBRATED VECTOR NETWORK ANALYSER

(75) Inventors: Thomas Reichel, Baldham (DE); Harald Jaeger, Bad Wurzach (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/507,820

(22) PCT Filed: Feb. 20, 2003

(86) PCT No.: PCT/EP03/01737

§ 371 (c)(1),
(2), (4) Date: Feb. 7, 2005

(87) PCT Pub. No.: WO03/076956

PCT Pub. Date: Sep. 18, 2003

(65) Prior Publication Data

US 2005/0119848 A1   Jun. 2, 2005

(30) Foreign Application Priority Data

Mar. 14, 2002   (DE) ................ 102 11 334

(51) Int. Cl.
  *G01R 23/16*   (2006.01)
  *G06F 19/00*   (2006.01)

(52) U.S. Cl. ...................................... 702/76

(58) Field of Classification Search ................ None
See application file for complete search history.

(56) References Cited

U.S. PATENT DOCUMENTS 4,641,086 A * 2/1987 Barr et al. .............. 324/76.22

(Continued)

FOREIGN PATENT DOCUMENTS

DE   39 12 795 A1   11/1989

OTHER PUBLICATIONS

"Selective Deconvolution: A New Approach to Extrapolation and Spectral Analysis of Discrete Signals", Franke, International Conference on Acoustics, Speech & Signal Processing, Apr. 6-9, 1987, pp. 1300-1303.

(Continued)

*Primary Examiner*—Bryan Bui
*Assistant Examiner*—Aditya Bhat
(74) *Attorney, Agent, or Firm*—Marshall, Gerstein & Borun LLP

(57) ABSTRACT

To measure the effective directivity and/or the effective source port match of a test port of a system-calibrated vector network analyser, a precision air line short-circuited at the outlet is connected, and the complex reflection coefficient is measured at the inlet of this precision air line at a sequence of measuring points within a predefined frequency range. At the same time, for the effective directivity the sequence of the measured complex reflection coefficients is subjected to a discrete Fourier transformation and the baseband filtered out of the spectrum thereby formed. The sequence of effective directivity values is obtained by subsequent inverse Fourier retransformation.

27 Claims, 9 Drawing Sheets

U.S. PATENT DOCUMENTS

| | | | | |
|---|---|---|---|---|
| 4,661,767 A | * | 4/1987 | Sharrit et al. | 324/638 |
| 4,703,433 A | * | 10/1987 | Sharrit | 702/76 |
| 4,845,423 A | | 7/1989 | Pollard | 324/74 |
| 4,982,164 A | | 1/1991 | Schiek et al. | 324/638 |
| 6,175,592 B1 | | 1/2001 | Kim et al. | 375/240 |

OTHER PUBLICATIONS

"New Algorithems of Extrapolation and Spectral Estimation for Discrete Band-Limited Signals Based on Fourier Transform", Si-Xiong et al., Proceedings of the International Symposium on Circuits and Systems, May 1-3, 1990, pp. 1546-1548.

Guidelines on the Evaluation of Vector Network Analysers (VNA), European Patent Office, May 2000, pp. 1-23.

International Search Report in PCT/EP03/01737 dated Sep. 2, 2003.

International Preliminary Examination Report in PCT/EP03/01737 dated Jun. 22, 2004.

* cited by examiner

METHOD OF MEASURING THE EFFECTIVE DIRECTIVITY AND/OR RESIDUAL SYSTEM PORT IMPEDANCE MATCH OF A SYSTEM-CALIBRATED VECTOR NETWORK ANALYSER

This is the U.S. national phase of International Application No. PCT/EP03/01737 filed Feb. 20, 2003, the entire disclosure of which is incorporated herein by reference.

BACKGROUND OF THE DISCLOSURE

1. Field of the Disclosure

The disclosure relates to a method of measuring the effective directivity (residual system directivity) and/or the effective source port match (residual system port impedance match) of a test port of a system-calibrated vector network analyser.

2. Related Technology

The great accuracy of vector network analysers (VNA) is based on the fact that, before the actual measurement of value and phase of the complex reflection coefficient, the network analyser is calibrated at its test ports by connecting calibration standards. Meanwhile there is a large number of different calibration methods. For system calibration, the most common of these use open-circuit, short-circuit and match calibration standards. By connecting these calibration standards to the test ports of the network analyser, it is possible to determine the errors occurring in the network analyser which lead to a deviation of the measured values from the true value, and this information may then be used in the subsequent object measurement for error correction by calculation. This is known for example from DE 39 12 795 A1. However, these calibration methods as commonly used to date are not sufficiently accurate.

In order to determine the still remaining residual uncertainty of the directivity and/or test port match, it is proposed in an EA guideline that a falsely-terminated or short-circuited precision coaxial air line, defined at the outlet, be connected to the test port to be measured of the previously system-calibrated network analyser, and that the reflection coefficients be measured at the inlet to this air line, at a sequence of measuring points within a predefined frequency range of the network analyser (EA-10/12, EA Guidelines on the Evaluation of Vector Network Analysers (VNA), European Co-operation for Accreditation, May 2000). According to this guideline, though, only the so-called ripple amplitude of the oscillation overlying the value of the reflection coefficients is evaluated, and it is assumed as a simplification that this ripple amplitude is broadly identical to the effective source port match, which however is true only if the effective directivity is ignored. This known verification standard using a precision air line is therefore relatively inaccurate and allows no precise estimate of the measuring uncertainty to be expected, let alone any subsequent correction of the error correction terms for the source port match.

SUMMARY

The disclosure provides a method of measurement and a set of calibration standards with which the effective directivity and/or effective source port match may be determined with substantially greater accuracy, and specifically with such accuracy that even the error correction values determined during system calibration and stored in the network analyser may be suitably re-corrected.

Accordingly, the disclosure provides, in a first aspect, a method of measuring the effective directivity of a test port of a system-calibrated vector network analyser by the steps of:
connecting a precision air line having an inlet and an outlet and short-circuited at the outlet;
measuring complex reflection coefficients at the inlet of the precision air line at a sequence of measuring points within a prescribed frequency range;
subjecting the sequence of the measured complex reflection coefficient to a discrete Fourier transformation to form a spectrum,
filtering out the baseband of the spectrum thereby formed, and
obtaining a sequence of effective directivity values is obtained by subsequent inverse Fourier retransformation.

In a second aspect, the disclosure provides a method of measuring the effective source port match of a test port of a system calibrated vector network analyser by the steps of:
connecting a precision air line having an inlet and an outlet and shortcircuited at the outlet;
measuring complex reflection coefficients at the inlet of the air line at a sequence of measuring points within a prescribed frequency range;
subjecting the sequence of the measured complex reflection coefficient to a complex Fourier transformation to form a spectrum,
filtering out the dominant component (carrier) from the spectrum thereby formed;
determining the size of the dominant component by inverse Fourier retransformation,
then filtering out the upper sideband at double the frequency of the dominant component,
again determining the size of this filtered-out upper sideband by inverse Fourier retransformation, and
finally, obtaining the sequence of effective source port match value by respective division of the variable of the dominant component (carrier) by the square of the variable of the upper filtered-out sideband.

Further, the disclosure provides a set of calibration standards for system calibration of vector network analysers with various calibration standards for open-circuit, short-circuit and match, assigned a data medium with values of the effective directivity which have been obtained according to the disclosed method.

Using the disclosed method, the measured complex reflection coefficients may be used to determine the effective directivity and/or the effective source port match with substantially greater accuracy than is possible using the known EA guideline. The determined measured values are available with a level of accuracy corresponding to that of the precision air line used. Here it is not important if the impedance of the precision air line used deviates from the reference impedance of the network analyser since even such impedance variations may be taken into account, so long as they are known. This correction is also possible even down to relatively low frequencies, at which the impedance of the air line differs increasingly from the nominal value due to the reducing skin effect. Since a variation in impedance of the air line is acceptable under the disclosed method, less costly air lines may also be used for the measurement, so long as adequate longitudinal homogeneity of the cross-sectional dimensions is ensured. Moreover, in principle it is only necessary to measure with a short-circuited precision air line, whereas using the known method it is still essential to make an additional measurement with a defined false termination. The additional measurement with a defined false termination of an air line as provided under the invention may be used to cover operating errors. By this means, routine checking and determination of the residual error in network analysers are considerably simplified.

A special advantage of the disclosed method is that, with the achievable accuracy in measurement of the effective source port match and/or the effective directivity, it is possible to correct the actual error correction values obtained through the preceding calibration of the network analyser and stored in the latter. In this way, the measuring accuracy of any such vector network analyser is substantially enhanced and a measuring accuracy is obtained which matches the quality of the precision air line. The disclosed method may be used both for network analysers with only one test port (reflectometer) and also for those with two or more test ports. In the case of several test ports, the measurement of effective directivity and effective source port match is made separately at each of the test ports.

Since the values for effective directivity and effective source port match measured by the disclosed method as a function of frequency are essentially to be included with the calibration standards used in system calibration of the network analyser, it makes sense to store these measured residual error values on a suitable data medium, for example in the form of measurement records or diagrams or as digital values on a diskette, and to add them to the calibration kit to be used in system calibration, so that the user, after calibrating his network analyser with the calibration standards, will immediately input the determined residual error values to the network analyser so that the calibration data stored there may be suitably corrected.

BRIEF DESCRIPTION OF THE DRAWINGS

The disclosure will be explained in detail below with the aid of schematic drawings and diagrams relating to a mathematical model. The drawings show as.

DETAILED DESCRIPTION

Figure 19:
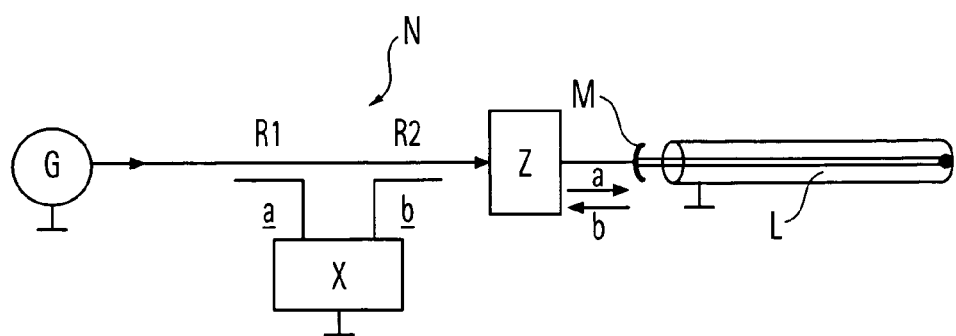

FIG. 19 shows the basic structure of a network analyser N, and specifically for the sake of simplicity a network analyser N with only one test M (reflectometer). An integral generator G feeds the test port M (outer test port in comparision with FIG. 1) with a measuring signal of variable frequency and specifically for example in equidistant frequency steps between 100 MHz and 40 GHz Inserted in the connecting line between generator G and test port M are two directional couplers RI and R2. The amplitude of a outgoing wave a is measured by RI and the amplitude of a reflected wave b by the outer unit R2. In order to calibrate a network analyser of this kind, various calibration standards such as open-circuit, short-circuit and match are connected in succession to the test port M and used to carry out calibration measurements. The error values thus determined are combined at an error two-input port Z and for example stored as error correction values in a microprocessor X in the network analyser.

To estimate the accuracy with which a network analyser of this kind is system-calibrated, a calibrated, a coaxial precision air line L of a prescribed minimum length is connected at the test port M, and is short-circuited at an outlet which faces away from the test port M. This air line may now be used to measure the complex reflection coefficient in the frequency range of the generator G at a succession of equidistant measuring points, from which the effective directivity and/or the effective source port match are determined in accordance with the mathematical model below. These may then be used to correct in turn the error correction values of the network analyser stored in the microprocessor X.

The following symbols are used in the mathematical model below:

$a_e, b_e$ prediction coefficients $A_{(n)}$ "carrier" signal within the recorded set of measured values (nth measuring point)

$A'_{(n)}$ mixed-down "carrier" (nth measuring point)

$\alpha$ damping constant of the reference air line $B_{(n)}$ "baseband" signal within the recorded set of measured values (nth measuring point)

Figure 1:
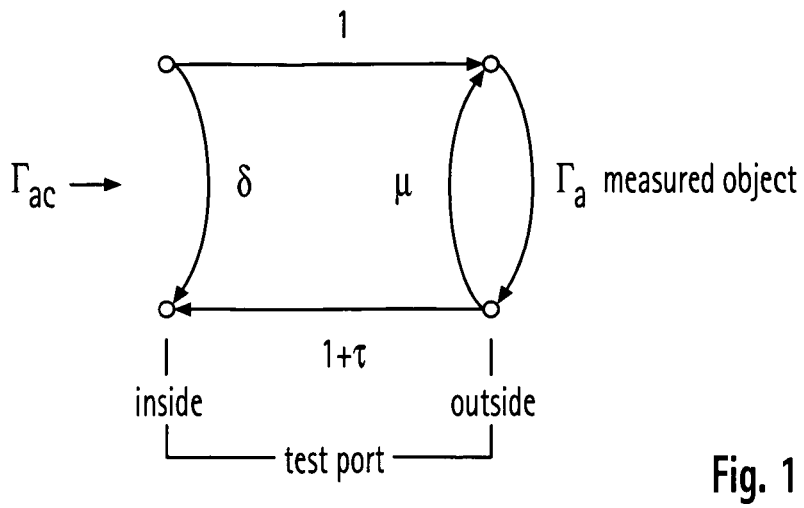
FIG. 1 the signal-flow graphs of a VNA for impedance measurement.
Figure 2:
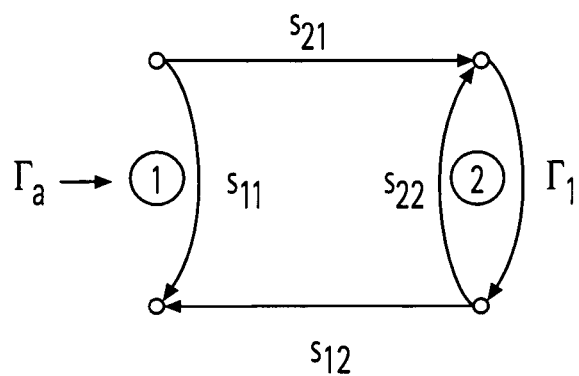
FIG. 2 the signal-flow graphs of a falsely-terminated line.

$\beta$ phase constant of the reference air line cfft(x) discrete (complex) Fourier transformation $C_{(n)}$ signal for the doubled carrier frequency within the recorded set of measured values (nth measuring point)

δ residual system directivity (effective directivity)
Δ error vector magnitude (value of the error vector)
$\Delta L_{1(2)}$ equivalent inductivity for the influence of the male connector at port 1 (2) of the reference air line
$\Delta C_{1(2)}$ equivalent capacity for the influence of the male connector at port 1 (2) of the reference air line
$\Delta X_{1(2)}$ reactance in series to the male connector 1 (2) of the reference air line
$\Delta Y_{1(2)}$ susceptance parallel to the male connector 1 (2) of the reference air line
e index
$E_{a(e)}$ number of points added by linear prediction at the start (a) or finish (e) of the sequence of measuring points
F "frequency" of the "carrier" signal
γ propagation constant of the reference air line
$\Gamma_a$ reflection coefficient of a measured object
$\Gamma_{ac}$ reflection coefficient $\Gamma_a$ (after system error correction)
$\Gamma_{ac_n}$ nth measuring point for $\Gamma_{ac}$
$\Gamma_{nc,mix}$ mixed-down sequence (nth measuring point)
$\Gamma_1$ reflection coefficient of the false termination at the outlet of the reference air line
κ proportionality constant
k index
$k_{max}$ maximum value of k
l overall length of the line between the reference plane of the VNA and the plane of the false termination
$l_1$ the length of the reference air line between the reference planes of the two male connectors
$l_2$ length of the line section in the physical component "false termination"
μ residual system port impedance match (effective source port match)
n, $n_a$, $n_c$ indices
N number of measuring points
ν index
p index
P number of prediction coefficients
$r_s$ standardised impedance deviation of the reference air line (equivalent reflection factor)
$s_{xy}$ s-parameter of the reference air line
$S_{ac_n}$ sideband signal (nth measuring point)
t time
$t_{1(2)}$ equivalent time constants for the male connector influence at port 1 (2) of the reference air line
T estimated value for the reflection tracking
τ residual system tracking
ω circuit frequency
$Z_0$ reference impedance of the VNA
ΔZ impedance deviation of the reference air line
Starting from FIG. 1

$$\Gamma_{ac} = \delta + (1+\tau)\Gamma_x + \mu\Gamma_a^2 \qquad (1)$$

applies for the reflection coefficients of a measured object corrected with allowance for the error terms.
According to FIG. 2

$$\Gamma_a = s_{11} + \frac{s_{12}s_{21}}{1 - s_{22} \cdot \Gamma_1} \cdot \Gamma_1 \qquad (2)$$

applies for the inlet-side reflection coefficients of an air line falsely terminated with $\Gamma_1$. Ignoring products of the terms δ, τ, μ, $s_{11}$ and $s_{22}$ together, we obtain:

$$\Gamma_{20} = \delta + s_{11} + (1+\tau+s_{22}\Gamma_1)s_{12}s_{21}\Gamma_1 + \mu s_{12}^2 s_{21}^2 \Gamma_1^2 \qquad (3).$$

Figure 3:
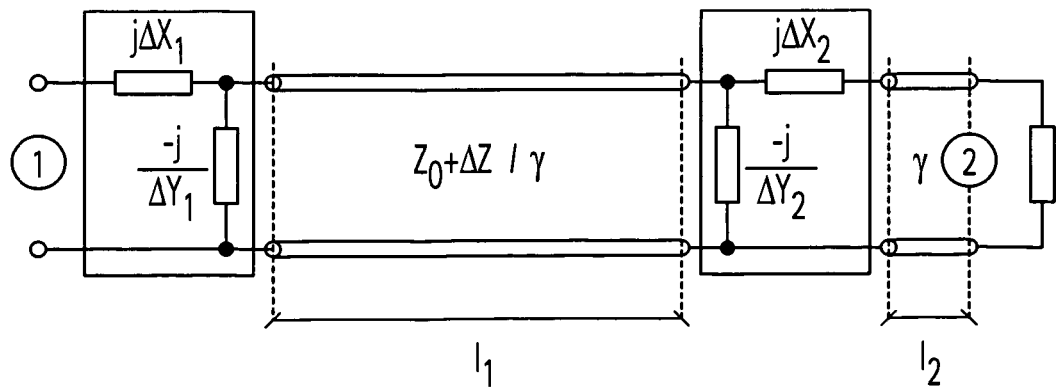
FIG. 3 the equivalent network diagram of a falsely-terminated air line.

To determine the s-parameter of the air line, use is made of the equivalent network diagram in FIG. 3. The homogeneous part of the air line between the two connectors has here the length $l_1$ and is characterised by the propagation constant γ=α+β and an impedance deviation ΔZ. The short line with length $l_2$ is part of the false termination with the reflection coefficient $\Gamma_1$, and specifically the section between the reference plane and the plane of the false termination. The impedance deviation of this section is assumed to be zero, and the propagation constant as great as that of the long homogeneous section of line. Any impedance deviations may be added in the form of reactances to the half-section between the two sections of line. The two half-sections represent the interference points formed by the HF connectors.
With $$l = l_1 + l_2 \qquad (4)$$

$$s_{12} = s_{21} \equiv e^{-\gamma l} \qquad (5)$$

applies as a simple approximation.
For the reflection parameters $$s_{11} = \frac{\Delta Z + j\Delta X_1}{2Z_0} - j\frac{\Delta Y_1 Z_0}{2} - \qquad (6)$$
$$\left[\frac{\Delta Z - j\Delta X_2}{2Z_0} + j\frac{\Delta Y_2 Z_0}{2}\right]e^{-2\gamma l_2}$$
$$= \frac{\Delta Z + j\Delta X_1}{2Z_0} - j\frac{\Delta Y_1 Z_0}{2} -$$
$$\left[\left[\frac{\Delta Z - j\Delta X_2}{2Z_0} + j\frac{\Delta Y_2 Z_0}{2}\right]e^{2\gamma l_2}\right]e^{-2\gamma l}$$

$$s_{22} = \left[\frac{\Delta Z + j\Delta X_2}{2Z_0} - j\frac{\Delta Y_2 Z_0}{2} - \right. \qquad (7)$$
$$\left. \left[\frac{\Delta Z - j\Delta X_1}{2Z_0} + j\frac{\Delta Y_1 Z_0}{2}\right]e^{-2\gamma l_1}\right]e^{-2\gamma l_2}$$
$$= \left[\frac{\Delta Z + j\Delta X_2}{2Z_0} - j\frac{\Delta Y_2 Z_0}{2}\right]$$
$$e^{-2\gamma l_2} - \left[\frac{\Delta Z - j\Delta X_3}{2Z_0} + j\frac{\Delta Y_1 Z_0}{2}\right]e^{-2\gamma l}$$

apply.

Case 1: $\Gamma_1 = -1$ (Verification with Outlet-side Short-circuit)
After inserting the expressions for $s_{11}$, $s_{22}$ and $s_{12}$, $s_{21}$ in equation 3, we obtain $$\Gamma_{ac} \cong \delta + \frac{\Delta Z + j(\Delta X_1 - \Delta Y_1 Z_0^2)}{2Z_0} + \qquad (8)$$
$$\left[\mu - \frac{\Delta Z - j(\Delta X_1 - \Delta Y_1 Z_0^2)}{2Z_0}\right]e^{-4\gamma l} -$$
$$\left[1 + \tau + \frac{\Delta Z}{Z_0}\sinh(2\gamma l_2) - j\frac{\Delta X_2 - \Delta Y_2 Z_0^2}{Z_0}\cosh(2\gamma l_2)\right]e^{-2\gamma l}$$

With Re $(2\gamma l_2) \ll 1$, the simplified relationship $$\Gamma_{ac} \cong \delta + \frac{\Delta Z + j(\Delta X_1 - \Delta Y_1 Z_0^2)}{2Z_0} + \qquad (9)$$
$$\left[\mu - \frac{\Delta Z - j(\Delta X_1 - \Delta Y_1 Z_0^2)}{2Z_0}\right]e^{-4\gamma l} -$$

-continued $$\left[1+\tau+j\frac{\Delta Z}{Z_0}\sin(2\beta l_2)-j\frac{\Delta X_2-\Delta Y_2 Z_0^2}{Z_0}\cos(2\beta l_2)\right]e^{2\gamma l}$$

applies.

With $$\Delta X_1 = \omega \Delta L_1 \quad (10)$$

$$\Delta X_2 = \omega \Delta L_2 \quad (11)$$

$$\Delta Y_1 = \omega \Delta C_1 \quad (12)$$

$$\Delta Y_2 = \omega \Delta C_2 \quad (13)$$

the following applies:

$$\Gamma_{ac} \cong \delta + \frac{\Delta Z + j\omega(\Delta L_1 - \Delta C_1 Z_0^2)}{2Z_0} + \left[\mu - \frac{\Delta Z - j\omega(\Delta L_1 - \Delta C_1 Z_0^2)}{2Z_0}\right]e^{-4\gamma l} - \left[1 + \tau + j\left[\frac{\Delta Z}{Z_0}\sin(2\beta l_2) - \omega\frac{\Delta L_2 - \Delta C_2 Z_0^2}{Z_0}\cos(2\beta l_2)\right]\right] \quad (14)$$

With $$r_z = \frac{\Delta Z}{2Z_0} \quad (15)$$

$$t_1 = \frac{\Delta L_1 - \Delta C_1 Z_0^2}{2Z_0} \quad (16)$$

$$t_2 = \frac{\Delta L_2 - \Delta C_2 Z_0^2}{2Z_0} \quad (17)$$

we finally obtain:

$$\Gamma_{ac} \cong \delta + r_z + j\omega t_1 + [\mu - r_z + j\omega t_1]e^{-4} - [1 + \tau + j/2\gamma_z \sin(2\beta l_2) - 2\omega t_2 \cos(2\beta l_2)]e^{-2\gamma l} \quad (18)$$

$\Gamma_{ac}$ is a function of the frequency, and in the case of a linear sweep, $$\omega = \kappa t \quad (19)$$

also a function of time. One may then imagine $\Gamma_{ac}$ as the sum of a complex oscillation with the carrier $$A = -[1+\tau+j/2r_z \sin(2\beta l_2) - 2\omega t_2 \cos(2\beta l_2)]]e^{-2\gamma l} \quad (20)$$

a baseband signal $$B = \delta + r_z + j\omega t_1 \quad (21)$$

and a signal at the double carrier frequency $$C = [\mu - r_z + j\omega t_1]e^{-4\gamma l} \quad (22),$$

leading to the characteristic ripple of $|\Gamma_{ac}|$ over the frequency. As will be shown below, the spectral portions of $\Gamma_{ac}$ referred to may be obtained through a discrete Fourier transformation (DFT) and subsequent filtering out, so that the sought variables $\delta$ and $\mu$ may be calculated as follows:

$$\mu = C \frac{[1+\tau+j[2r_2\sin(2\beta l_2) - 2\omega t_2\cos(2\beta l_2)]]^2}{A^2} + r_z - j\omega t_1 \quad (23)$$

$$\delta = B - (r_z + j\omega t_l) \quad (24).$$

Equation 23 may be further simplified without much change in the accuracy with which $\mu$ may be determined:

$$\mu \cong \frac{C}{A^2} + (r_z - j\omega t_1). \quad (25)$$

The terms $r_z \pm j\omega t_l$ define an error vector which stems only from the air line used, and their value corresponds to the impedance deviation (including male connector influence). If this vector or at least the more easily determined variable $r_z$ is available, then air lines with greater impedance tolerance may also be used.

Correction of the error terms "system directivity" (directivity) D and "system port impedance match" (source port match) M of the VNA using the values obtained is effected by the following equations:

$$D_{neu} = D_{alt} + \delta T \quad (26)$$

$$M_{neu} = M_{alt} + \mu \quad (27).$$

Case 2: $|\Gamma_1| < 0.1$ (Verification with Small Outlet-side False Termination)

For this case, equation 3 may first of all be simplified:

$$\Gamma_{ac} \cong \delta + s_{11} + (1+\tau+s_{22}\Gamma_l)s_{12}s_{21}\Gamma_1 \quad (28)$$

After inserting the s-parameter of the air line, we obtain $$\delta + \frac{\Delta Z + j(\Delta X_1 - \Delta Y_1 Z_0^2)}{2Z_0} - \frac{\Delta Z - j(\Delta X_1 - \Delta Y_1 Z_0^2)}{2Z_0}\Gamma_1^2 e^{-4rl} + \left(\Gamma_1 + \tau\Gamma_1 + \left[\frac{\Delta Z + j\Delta X_2}{2Z_0} - j\frac{\Delta Y_2 Z_0}{2}\right]\Gamma_1^2 e^{-2\gamma l_2} - \left[\frac{\Delta Z - j\Delta X_2}{2Z_0} + j\frac{\Delta Y_2 Z_0}{2}\right]e^{-2\gamma l_2} -\right)e^{2\gamma l}. \quad (29)$$

The signal contains three spectral components—baseband (lower sideband), "carrier" (. . . $xe^{-2\gamma l}$) and upper sideband (. . . $xe^{-4\gamma l}$)—of which the upper sideband is not likely to be capable of evaluation owing to its small magnitude. The "carrier" contains no information of interest, and the baseband is identical to that obtained for the short-circuited air line (term B in equation 21).

The evaluation of the measured results is explained below.

Case 1: $\Gamma_1 = -1$ (Verification with Outlet-side Short-circuit)

Figure 4:
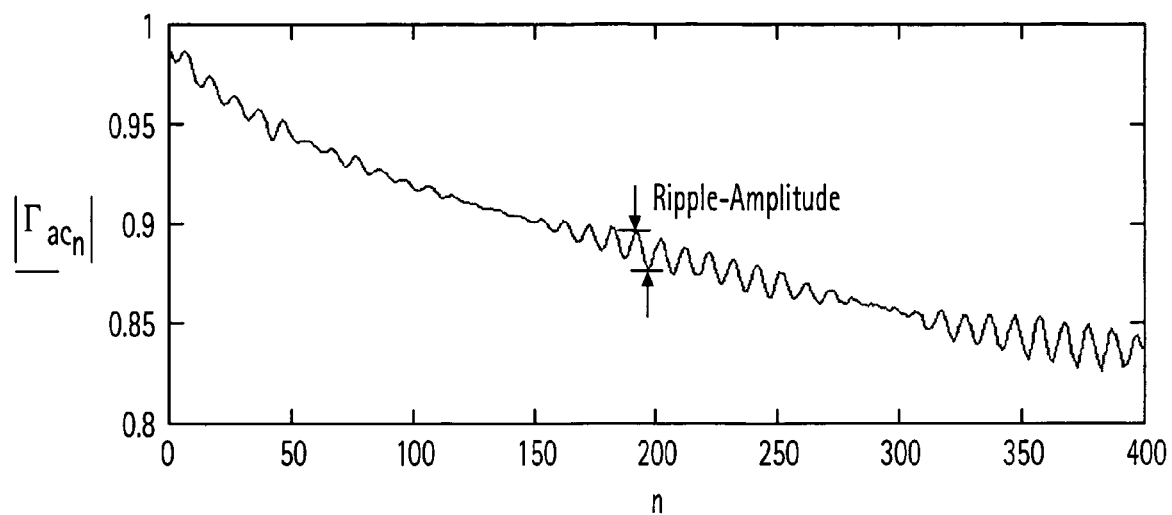
FIG. 4 measured values for the value of the reflection coefficient at the inlet of the short-circuited air line.
Figure 5:
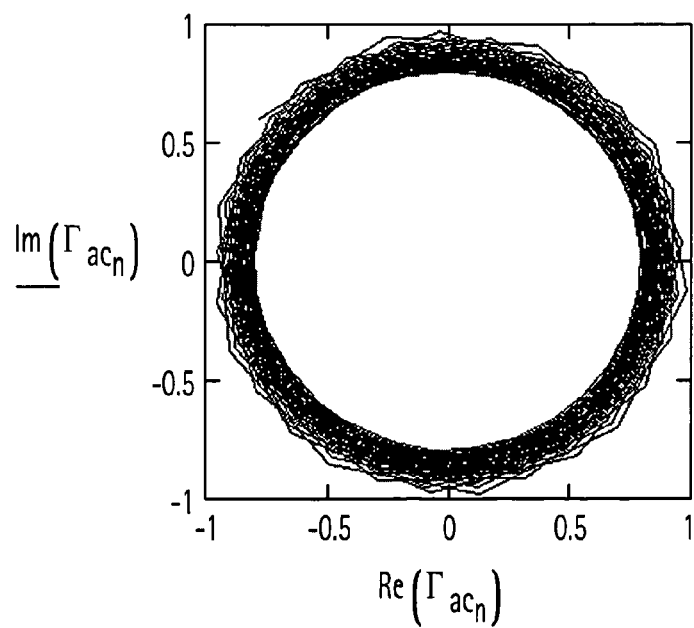
FIG. 5 measured values for the complex reflection coefficients at the inlet of the short-circuited air line in a parametric representation.
Figure 6:
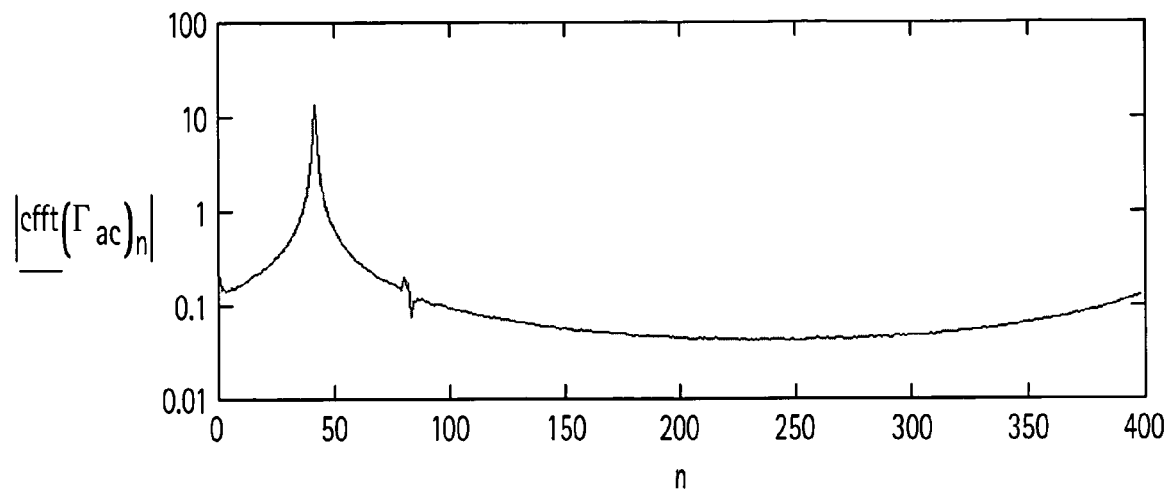
FIG. 6 the discrete Fourier transformation (DFT) of the reflection coefficient at the inlet of the short-circuited air line.

Determination of the components B and $C/A^2$ from the measured results for $\Gamma_{ac}$ is described below. Here it is assumed that N equidistant measuring points $\Gamma_{nc}(n=0\ldots N-1)$ are available (FIGS. 4 and 5):

1) Fourier transformation with search for the dominating component F (FIG. 6).
2) Zero mixing of the carrier by multiplying $\Gamma_{ac_n}$ by $$e^{j2\pi F\frac{n}{N}}: \quad (30)$$

$$\Gamma_{ac,mix_4} = \Gamma_{ac_n} \cdot e^{j2\pi F\frac{n}{N}}$$

3) Extension of the point sequence $\Gamma_{ac,mix}$ my adding $E_e$ points at the end ($n_c$=N . . . N+$E_e$-1), which are obtained by extrapolation with a linear predictor via the last P points (p=N-P-1 . . . N-1).

4) Extension of the point sequence by adding $E_c$ points at the beginning ($n_a$=-$E_a$, . . . -1), obtained by extrapolating the reflected sequence $\Gamma_{ac,mix}$=$\Gamma_{ac,mix}$(v=0 . . . N+$E_c$-1) in the manner described under 3 above.

Figure 7:
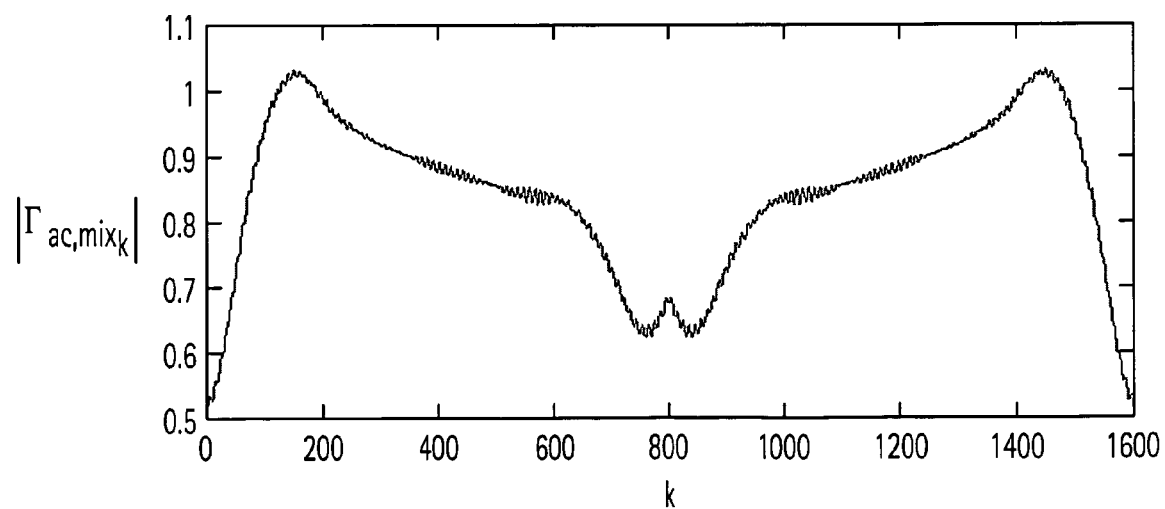
FIG. 7 extended and reflected point sequence.

5) The extrapolated reflected sequence of 4) with N+$E_a$+$E_c$ points is reflected back and the sequence of 4) added to it, resulting in a new sequence $\Gamma_{ac,mix_k}$ with k=2 (N+$E_a$+$E_e$) points. By definition the beginning and end points have the same value (FIG. 7).

Figure 8:
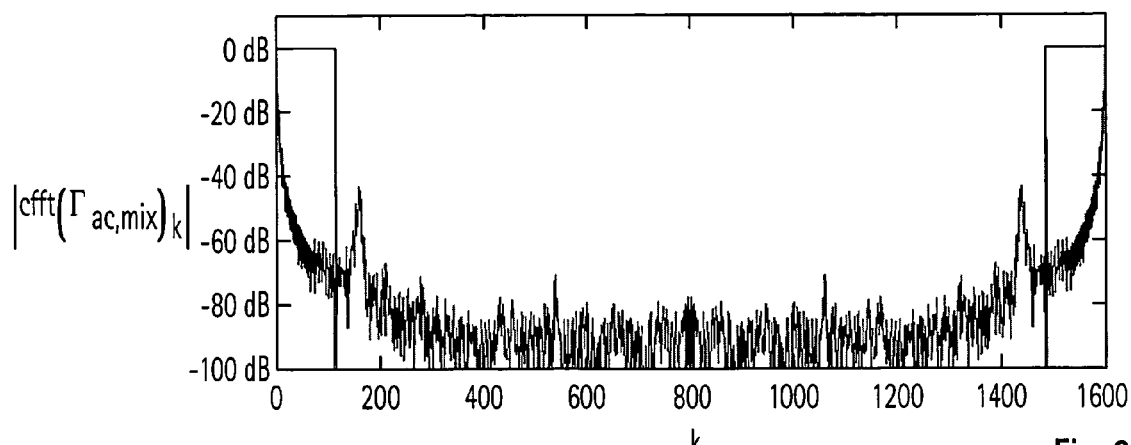
FIG. 8 filtering-out of the mixed-down carrier with low-pass transfer function.

6) Discrete Fourier transformation and obtaining of the mixed-down carrier with an ideal low-pass filter (rectangular transfer function, no delay time, see FIG. 8).

7) Inverse Fourier transformation of the carrier and cutting out of the intersecting section of $$A'_n(n=0 \ldots N-1).$$

Figure 9:
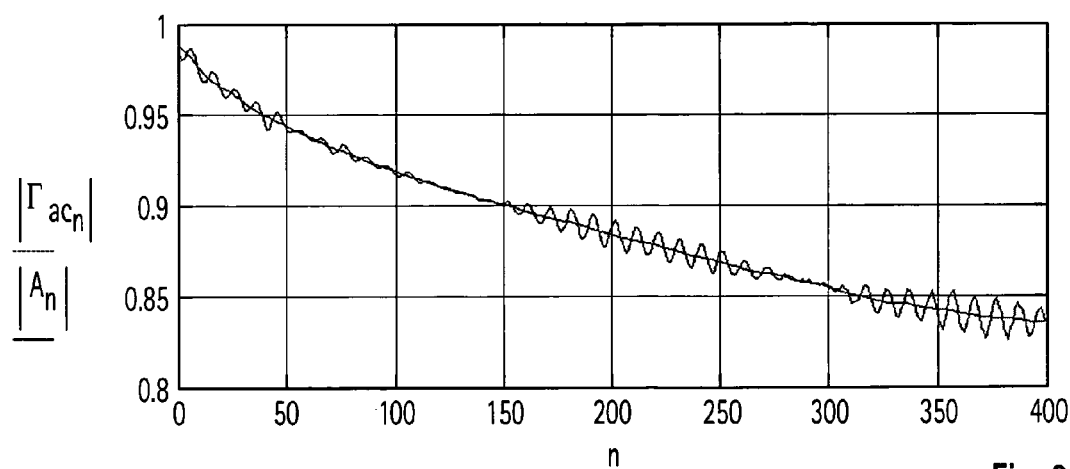
FIG. 9 the values of the reflection coefficient and the carrier component in comparison.

8) Obtaining the carrier in the original position by mixing upwards (FIG. 9):

$$A_n = A'_n e^{-j2\pi F \frac{n}{N}} \quad (31)$$

Figure 10:
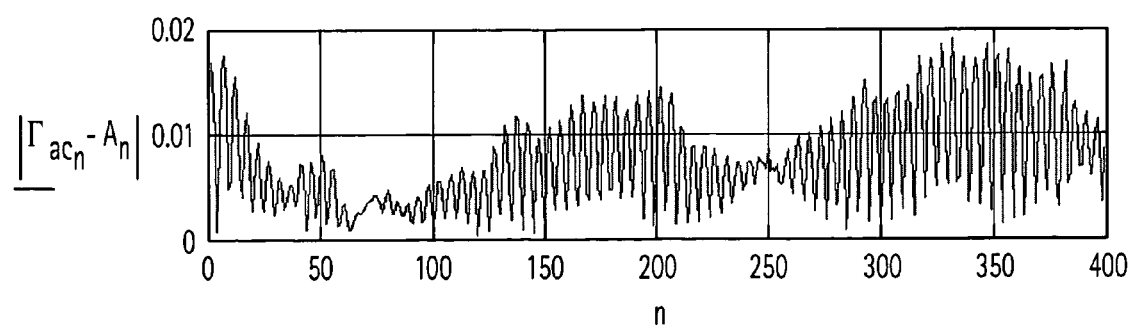
FIG. 10 the value of the sideband signal.

9) Subtraction of the carrier from $\Gamma_{ac_n}$, so that the baseband signal and the signal for the doubled carrier sequence are left over (FIG. 10):

$$S_{ac_n} = \Gamma_{ac_n} - A_n \quad (32)$$

Figure 11:
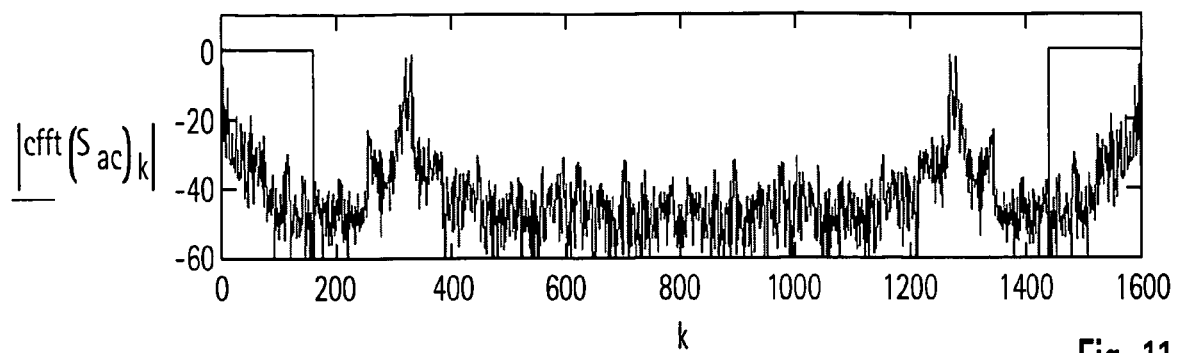
FIG. 11 the spectrum of the sideband signal with low-pass transfer function.
Figure 12:
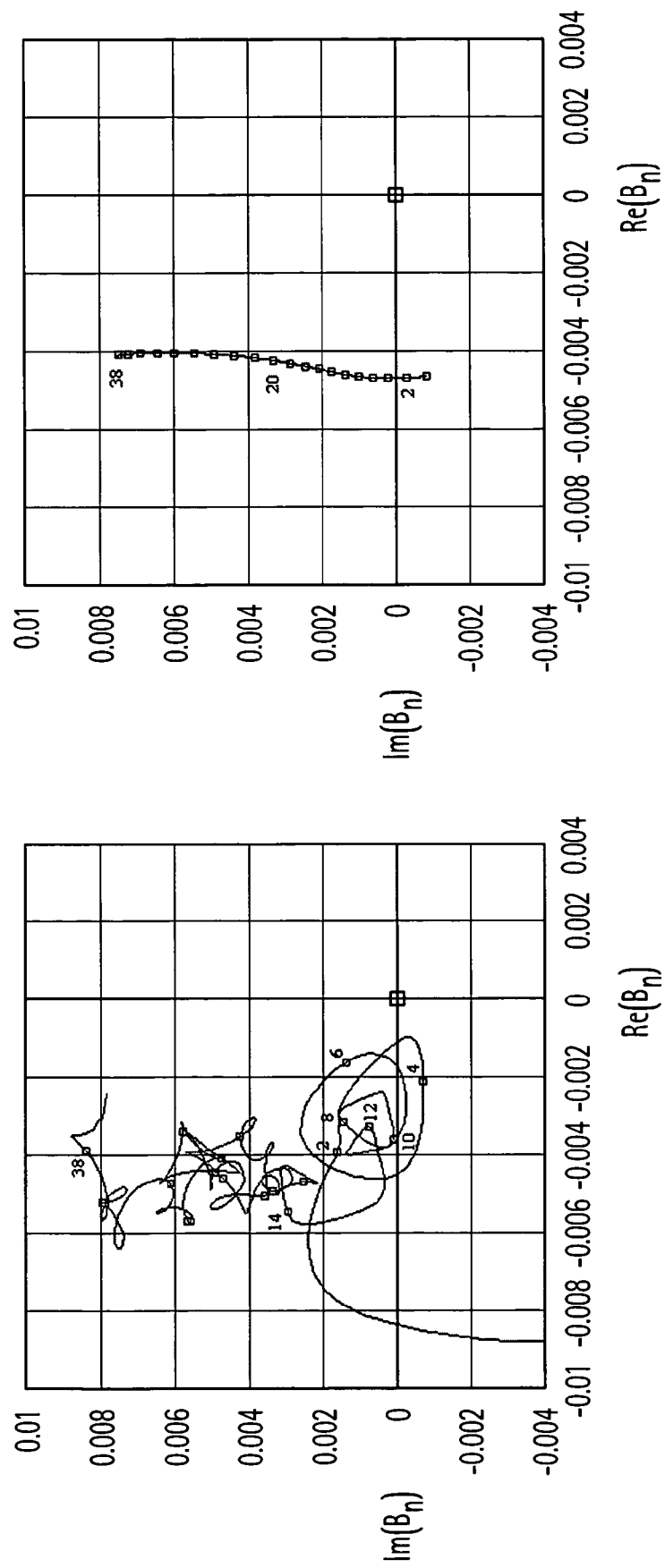
FIG. 12 the component $B_n$ in polar coordinate display format (parameter: frequency in GHz). The right-hand chart is obtained with a greatly reduced bandwidth of the low-pass filter (1/40)

10) Obtaining the baseband signal ($B_n$) from $S_{ac}$ (FIGS. 11, 12), as for 3) to 7).

Figure 13:
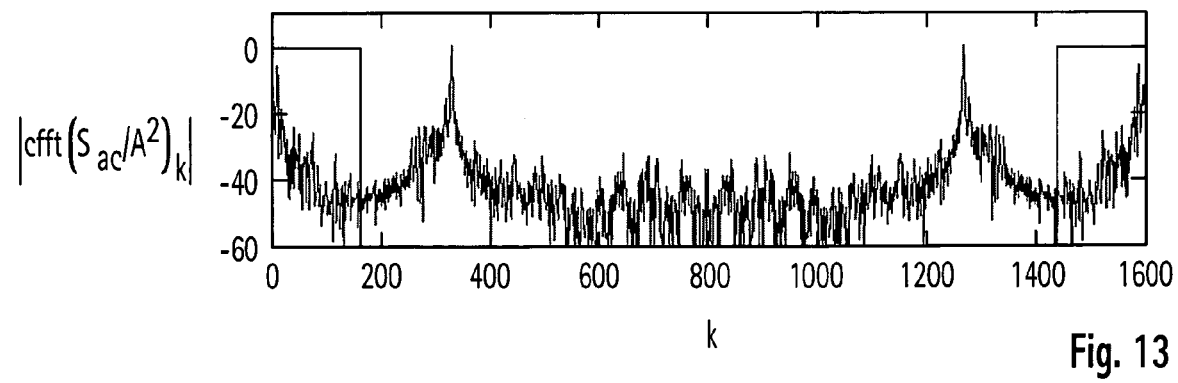
FIG. 13 the spectrum of the term $S_{ac}/A^2$ with low-pass transfer function.

11) Obtaining the term $C_n/A_n^2$ from $S_{ac}/A^2$ (FIGS. 13, 14, 15) as for 3) to 7).

Figure 16:
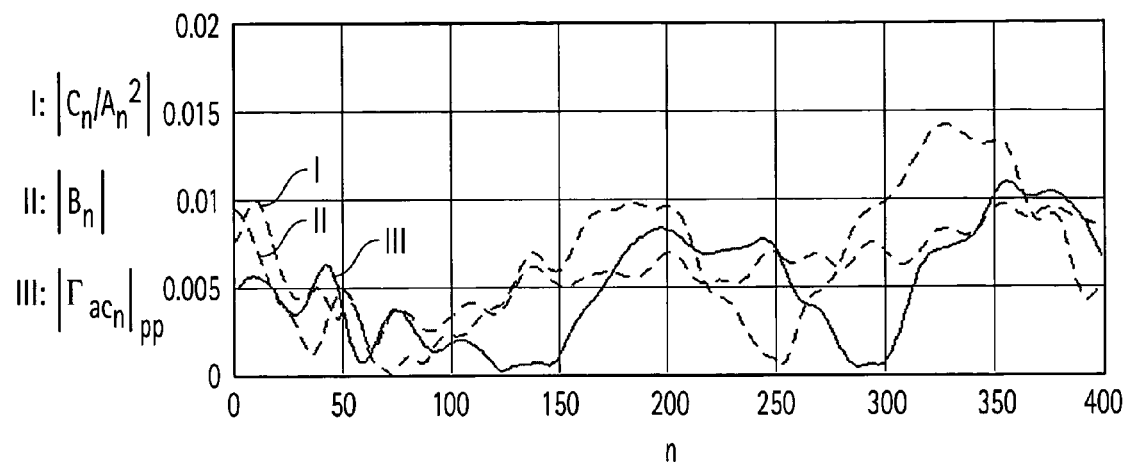
FIG. 16 the ripple amplitude of the measured result according to FIG. 4 in comparison with the values of the measured results for "residual system directivity" and "residual system port impedance match" using the method according to the invention (f/GHz=n/10)

FIG. 16 shows the result of the values thus calculated from the measured reflection coefficients for the value of the effective directivity and the value of the effective source port match, and specifically in comparison with the value of the ripple amplitude of the oscillation which is superimposed on the value of the reflection coefficients. FIG. 16 shows that there are considerable differences between this ripple amplitude, formerly evaluated on its own, and the values measured in accordance with the disclosure, with the values measured in accordance with the invention and evaluated separately being significantly more accurate.

For the usability of the disclosed method it is quite important that the "spectra" of the components B and C do not overlap that of the carrier A, i.e, that the distances of the reflections contained in B and C from the reference plane are less than the length of the air line. This in turn means that "residual system directivity" and "residual system port impedance match" should no longer contain any portions of the physical network analyser, but only portions stemming from the inadequacy of the calibration standards used. Consequently the disclosed method may be implemented only after system calibration of the VNA.

A quite major difficulty in obtaining spectral portions from an endless section of time arises from the fact that the Fourier transformation forms the spectrum of the periodically repeated signal section. Apart form the discretization in frequency terms, this gives rise to spectral components which are not actually present in the signal. If now the sought portions are cut out of this distorted spectrum, then inevitably some of the lines added by the periodic repetition are also lost, so that the pattern over time after transformation is additionally distorted.

There are two known methods of reducing this effect. On the one hand the signal section may be made part of a window before the Fourier transformation, so that the signal begins and ends close to zero and thus only minimal spectral distortion occurs. However it is not possible to rely on the beginning and end coinciding after retransformation, i.e. the method does not function over the whole signal section, i.e. only over the range 8 GHz to 32 GHz for a set of measured values extending over 100 MHz to 40 GHz.

In the second known method, the reflected pattern is once again attached to the available signal section, which at least enforces a steady pattern and thus minimal spectral distortions of the periodically repeated signal. Nevertheless here too the beginning and end of the signal section may be used only with limitations after retransformation.

The disclosed method also utilises the possibility of reflection, but before that makes an extrapolation of the signal section over the end and the beginning (in the direction of "negative frequency values"). For extrapolation, a linear predictor is used, which leads to a steady and—in terms of frequency continuity—differentiable pattern at the end points. After doubling of the signal section through reflection, the discrete Fourier transformation (DFT) is effected, obtaining the desired spectral portion and retransformation. The boundary sections, i.e. the extrapolated portions, which are in any case only slightly distorted, are then cut off and the remaining signal is further processed Linear prediction allows the calculation of the extrapolated values as a linear combination of preceding values:

$$\Gamma_{2c_n} = \sum_{e=1}^{E} a_e \mathrm{Re}(\Gamma_{2c_{n-a}}) + j \sum_{e=1}^{E} b_e \mathrm{Im}(\Gamma_{2c_{n-a}}). \quad (33)$$

Figure 17:
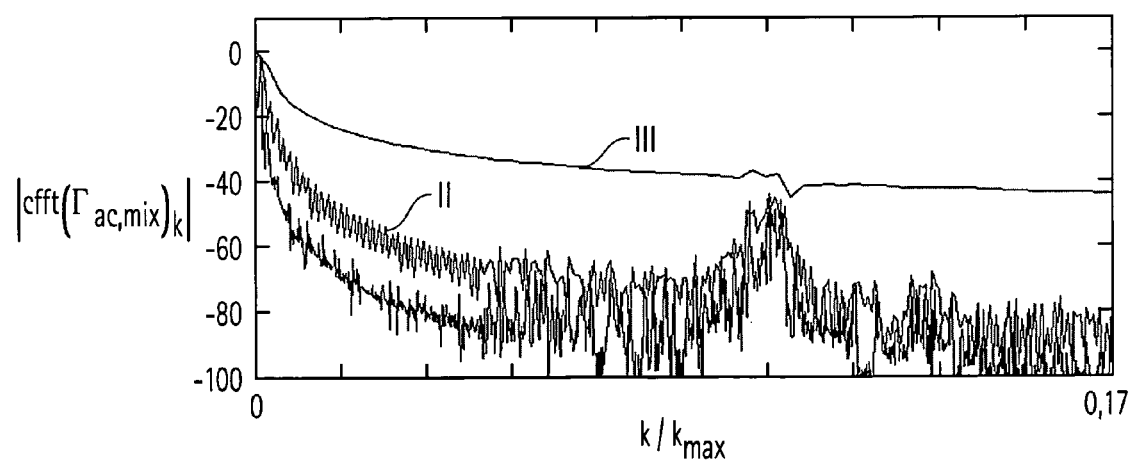
FIG. 17 a section of the spectrum of the mixed-down signal according to FIG. 8, shown for different degrees of extrapolation. I: upper extrapolation, upper reflection, 400 points. II: 1600 points corresponding to FIG. 7 (8). III: correspond to FIG. 18.
Figure 18:
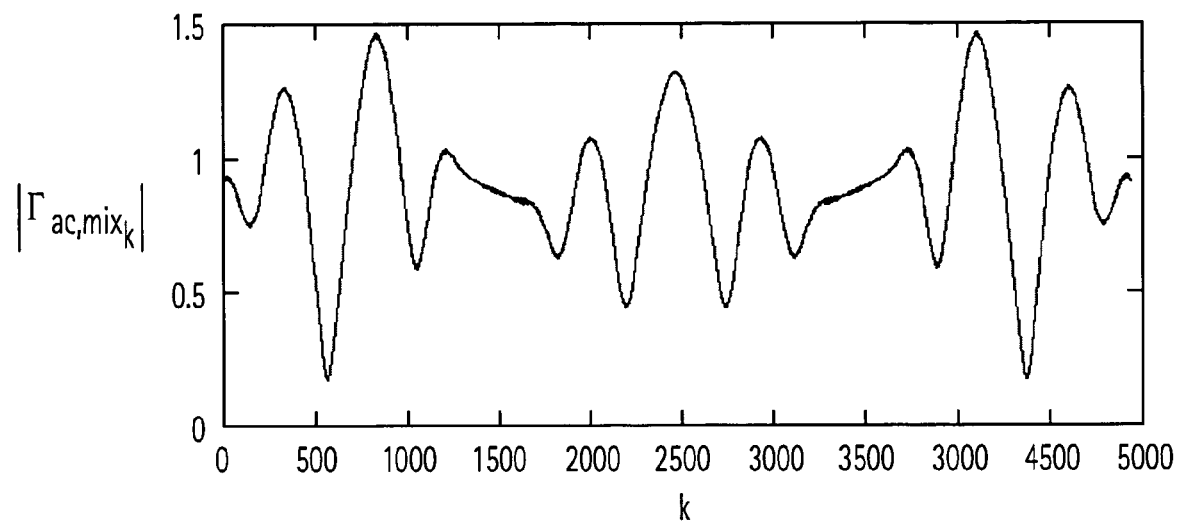
FIG. 18 the point sequence with measuring points from FIG. 1, greatly extended and led to locate extremes, and FIG. 19 the basic structure of a network analyser.

Here the weights $a_c$ and $b_e$ are so determined that the application of equation (33) within the measured signal section leads to the smallest possible errors. The mathematical processes for its determination are described in the relevant literature. It has been found that an extension of the measured signal section to double the value is normally sufficient for the purposes of the invention. By adding even more points, and if possible up to a local extreme of the value (FIG. 18), on the one hand the frequency resolution is further enhanced, and on the other hand the scope for enhanced selectivity of the method is created (FIG. 17). The latter is important when the baseband and the frequency band for the doubled carrier frequency are relatively broad and come close to the carrier (generated by reflections which are relative far removed from the reference plane).

Figure 14:
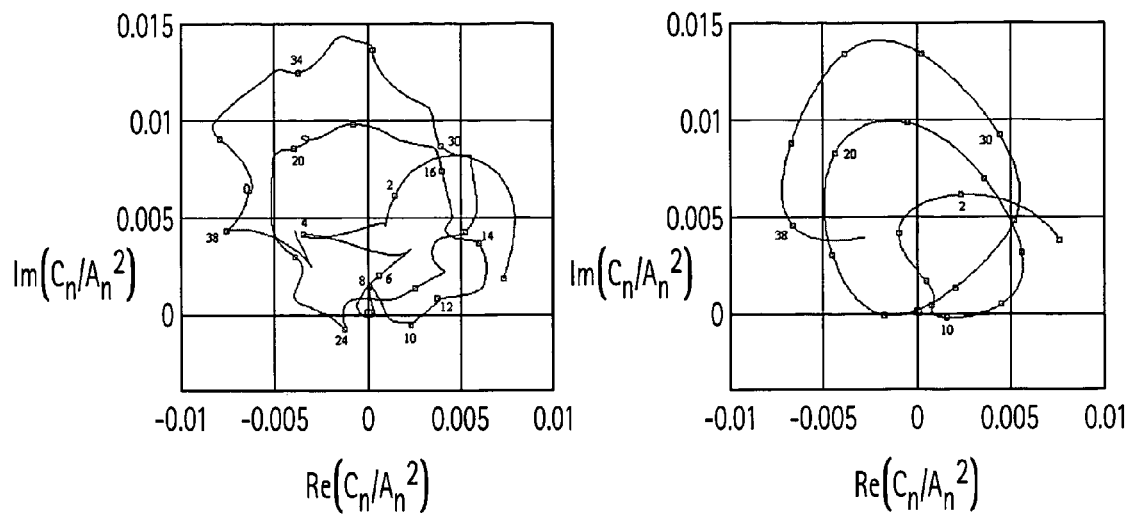
FIG. 14 the component $C_n/A_n^2$ in polar coordinate display format (parameter: frequency in GHz). The right-hand chart is obtained with a greatly reduced bandwidth of the low-pass filter (1/5)
Figure 15:
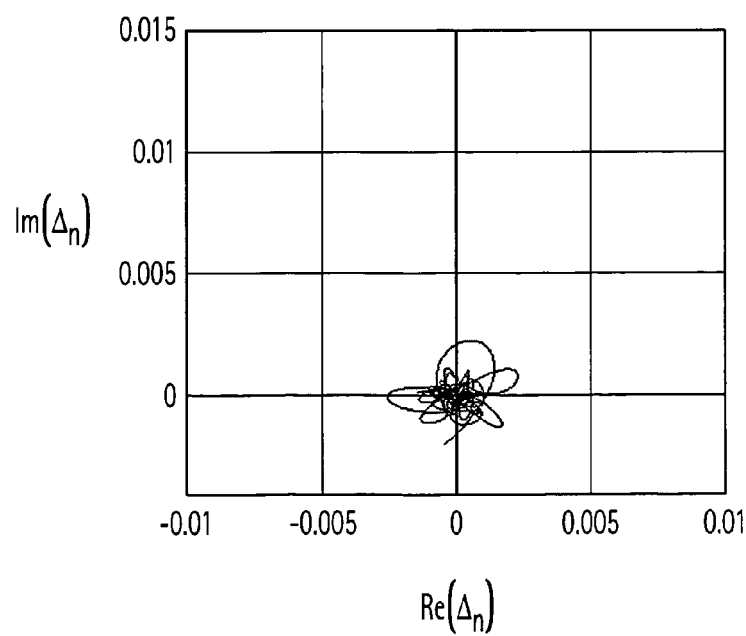
FIG. 15 the vector difference of the measured result according to FIG. 14.

The sought spectral components are obtained by low-pass filtering and subsequent retransformation. It is quite satisfactory to use "ideal" low passes with rectangular transfer function (1 in the passband range, 0 in the attenuation band), with a bandwidth chosen so that the transfer from the passband to the attenuation band lies in the middle between the two spectral components. Any restriction of the bandwidth below this value leads on the one hand to a (desired) reduction of the noise overlying the measured result, but may on the other hand lead to distortions of the measured result, if relevant spectral portions are eliminated by this action. In practice it is necessary to find a compromise, in which the choice of bandwidth for the measuring task described might be rated as non-critical (FIGS. 14 and 15). Even with extreme reduction (FIG. 12 right), reasonable measured results could be obtained. If it is remembered that the preceding system calibration was carried out by the OSM method (calibration standards Open, Short and Match), and that a sliding load from 4 GHz upwards was used, then the result is also easily explained: since the air line section of sliding load and reference air line differ mainly due to their characteristic (frequency-independent and real) impedance, and to the reactances of the plug connections at the reference plane, which rise in proportion to frequency, a curve such as that of FIG. 12 (right) is also to be expected in purely theoretical terms.

Case 2: $|\Gamma_1|<0.1$ (Verification with Small Outlet-side False Termination)

The evaluation may be made under precisely the same procedure as for the verification with short-circuit (item 11 is omitted). The result for effective directivity ("residual system directivity") should be identical to that obtained for the verification with short-circuit. No requirements are set for the magnitude of the false termination relative to the effective directivity (in contrast to the ripple evaluation according to the prior art).

Discrete Fourier transformation (DFT) of the extended and reflected sequence of reflection measured values actually produces a time signal comparable to the pulse response of the system. If nevertheless the term "spectrum" has been used for this purpose above, then this is only because the associated terms and concepts are more familiar. Incidentally, it is possible through equation (19) to imagine the reflection coefficients as a time signal, so that the term "spectrum" for the DFT of the reflection coefficients has its justification. The mathematical algorithms used are in any case to be used irrespective of the terminology.

The invention claimed is:

1. Method of measuring the effective directivity of a test port of a system-calibrated vector network analyzer by the steps of:
   connecting a precision air line having an inlet and an outlet and short-circuited at the outlet;
   measuring complex reflection coefficients at the inlet of the precision air line at a sequence of measuring points within a prescribed frequency range;
   subjecting the sequence of the measured complex reflection coefficients to a discrete Fourier transformation to form a spectrum;
   filtering out the baseband from the spectrum; and
   obtaining a sequence of effective directivity values by subsequent inverse Fourier retransformation, wherein the precision air line has an impedance deviating from a system impedance of the network analyzer by a known value, the method comprising taking the known impedance deviation into account as appropriate correction values in determining the sequence of values of the effective directivity and/or effective source port match.

2. Method of measuring the effective source port match of a test port of a system calibrated vector network analyzer by the steps of:
   connecting a precision air line having an inlet and an outlet and shortcircuited at the outlet;
   measuring complex reflection coefficients at the inlet of the precision air line at a sequence of measuring points within a prescribed frequency range;
   subjecting the sequence of the measured complex reflection coefficients to a complex Fourier transformation to form a spectrum;
   filtering out the dominant component (carrier) from the spectrum;
   determining the size of this dominant component by inverse Fourier retransformation;
   then filtering out an upper sideband at double the frequency of the dominant component;
   determining the size of the filtered-out upper sideband by inverse Fourier retransformation; and
   finally, obtaining a sequence of effective source port match value by respective division of the variable of the dominant component (carrier) by the square of the variable of the upper filtered-out sideband wherein the precision air line has an impedance deviating from a system impedance of the network analyzer by a known value, the method comprising taking the known impedance deviation into account as appropriate correction values in determining the sequence of values of the effective directivity and/or effective source port match.

3. Method of measuring the effective directivity and the effective source port match of a test port of a system-calibrated vector network analyzer by the steps of:
   (a) connecting a precision air line having an inlet and an outlet and short-circuited at the outlet;
   (b) measuring complex reflection coefficients at the inlet of the precision air line at a sequence of measuring points within a prescribed frequency range;
   (c) subjecting the sequence of the measured reflection coefficients to a discrete Fourier transformation to form a spectrum;
   (d) filtering out the baseband and the dominant component (carrier) from the spectrum;
   (e) determining the size of this dominant component, and;
   (f) obtaining a sequence of effective directivity values by inverse Fourier transformation wherein the precision air line has an impedance deviating from a system impedance of the network analyzer by a known value, the method comprising taking the known impedance deviation into account as appropriate correction values in determining the sequence of values of the effective directivity and/or effective source port match.

4. Method according to claim 1, comprising the steps of extrapolating the sequence of the measure complex reflection coefficients by linear prediction before the complex Fourier transformation of the sequence of the measured complex reflection coefficients, and extending the original sequence by reflecting this extrapolated sequence of complex reflection coefficients.

5. Method according to claim 4, comprising the step of multiplying the sequence of complex reflection coefficients by a factor such that the dominating component (carrier) lies at the frequency zero due to downwards mixing in the spectrum before the linear prediction.

6. Method according to claim 1 comprising the steps of connecting an air line with a slight false termination at the outlet ($|1'_e|<0.1$) to the test port to be measured of the system-calibrated vector network analyzer, and then treating the measured complex reflection coefficients in accordance with the steps of claim 1.

7. Method according to claim 1, comprising the step of connecting system error terms of the network analyzer by the obtained values of the effective directivity.

8. Method according to claim 1, comprising the step of storing the obtained sequence of values of the effective directivity on a data medium which may be driven together with the calibration standards used for system calibration of the network analyzer.

9. Set of calibration standards for system calibration of vector network analyzers with various calibration standards for open-circuit, short-circuit and match, assigned a data medium with values of the effective directivity which have been obtained according to the method of claim 1.

10. Method according to claim 1, comprising the step of storing the obtained sequence of values of the effective source port match on a data medium which may be driven together with the calibration standards used for system calibration of the network analyzer.

11. Set of calibration standards for system calibration of vector network analyzers with various calibration standards for open-circuit, short-circuit and match, assigned a data medium with values of the effective source port match which have been obtained according to the method of claim 1.

12. Method according to claim 2, comprising the steps of extrapolating the sequence of the measure complex reflection coefficients by linear prediction before the complex Fourier transformation of the sequence of the measured complex reflection coefficients, and extending the original sequence by reflecting this extrapolated sequence of complex reflection coefficients.

13. Method according to claim 12, comprising the step of multiplying the sequence of complex reflection coefficients by a factor such that the dominating component (carrier) lies at the frequency zero due to downwards mixing in the spectrum before the linear prediction.

14. Method according to claim 2 comprising the steps of connecting an air line with a slight false termination at the outlet ($I1'_e$<0.1) to the test port to be measured of the system-calibrated vector network analyzer, and then treating the measured complex reflection coefficients in accordance with the steps of claim 1.

15. Method according to claim 2, comprising the step of connecting system error terms of the network analyzer by the obtained values of the effective directivity.

16. Method according to claim 2, comprising the step of storing the obtained sequence of values of the effective directivity on a data medium which may be driven together with the calibration standards used for system calibration of the network analyzer.

17. Set of calibration standards for system calibration of vector network analyzers with various calibration standards for open-circuit, short-circuit and match, assigned a data medium with values of the effective directivity which have been obtained according to the method of claim 2.

18. Method according to claim 2, comprising the step of storing the obtained sequence of values of the effective source port match on a data medium which may be driven together with the calibration standards used for system calibration of the network analyzer.

19. Set of calibration standards for system calibration of vector network analyzers with various calibration standards for open-circuit, short-circuit and match, assigned a data medium with values of the effective source port match which have been obtained according to the method of claim 2.

20. Method according to claim 3, comprising the steps of extrapolating the sequence of the measure complex reflection coefficients by linear prediction before the complex Fourier transformation of the sequence of the measured complex reflection coefficients, and extending the original sequence by reflecting this extrapolated sequence of complex reflection coefficients.

21. Method according to claim 20, comprising the step of multiplying the sequence of complex reflection coefficients by a factor such that the dominating component (carrier) lies at the frequency zero due to downwards mixing in the spectrum before the linear prediction.

22. Method according to claim 3 comprising the steps of connecting an air line with a slight false termination at the outlet ($I1'_e$<0.1) to the test port to be measured of the system-calibrated vector network analyzer, and then treating the measured complex reflection coefficients in accordance with the steps of claim 1.

23. Method according to claim 3, comprising the step of connecting system error terms of the network analyzer by the obtained values of the effective directivity.

24. Method according to claim 3, comprising the step of storing the obtained sequence of values of the effective directivity on a data medium which may be driven together with the calibration standards used for system calibration of the network analyzer.

25. Set of calibration standards for system calibration of vector network analyzers with various calibration standards for open-circuit, short-circuit and match, assigned a data medium with values of the effective directivity which have been obtained according to the method of claim 3.

26. Method according to claim 3, comprising the step of storing the obtained sequence of values of the effective source port match on a data medium which may be driven together with the calibration standards used for system calibration of the network analyzer.

27. Set of calibration standards for system calibration of vector network analyzers with various calibration standards for open-circuit, short-circuit and match, assigned a data medium with values of the effective source port match which have been obtained according to the method of claim 3.

* * * * *